United States Patent [19]

Strauch et al.

[11] 4,107,679
[45] Aug. 15, 1978

[54] FREQUENCY MODULATOR FOR HIGH-PRECISION RANGE MEASUREMENTS

[75] Inventors: Raymond Strauch, Viroflay; Michel Riffiod, Paris, both of France

[73] Assignee: Telecommunications Radioelectriques et Telephoniques T.R.T., Paris, France

[21] Appl. No.: 777,110

[22] Filed: Mar. 14, 1977

[30] Foreign Application Priority Data

Mar. 12, 1976 [FR] France .................. 76 07058

[51] Int. Cl.² .............................................. G01S 9/26
[52] U.S. Cl. ................................................. 343/7.5
[58] Field of Search ........................................ 343/7.5

[56] References Cited

U.S. PATENT DOCUMENTS

| 2,779,018 | 1/1957 | Gregoire et al. | 343/7.5 X |
| 3,551,813 | 12/1970 | Kaneko | 343/7.5 X |
| 4,019,138 | 4/1977 | Watanabe et al. | 343/7.5 X |

FOREIGN PATENT DOCUMENTS 1,557,670  2/1969  France ......................... 343/7.5

*Primary Examiner*—Malcolm F. Hubler
*Attorney, Agent, or Firm*—Frank R. Trifari; Algy Tamoshunas

[57] ABSTRACT

A range measuring apparatus of the linear frequency modulation type is disclosed which comprises a measuring control loop for rendering the beat frequency between the transmitted and received frequencies equal to a fixed frequency. The apparatus further includes means for forming a permanent second beat signal between two signals derived from the generator supplying the frequency modulated signal, one of these signals being delayed by means of the delay line. A phase detector receives this second pulsed signal and the signal of a controlled frequency oscillator and supplies a signal which controls the slope of the frequency modulation. The error signal of the measuring control loop controls the frequency of the signal from the oscillator. This arrangement results in an increased precision in the range measurements.

4 Claims, 5 Drawing Figures

FREQUENCY MODULATOR FOR HIGH-PRECISION RANGE MEASUREMENTS

The invention relates to a range measuring device, particularly for height measurements, comprising a generator controlled by a modulator for supplying a linearly frequency-modulated signal, means for transmitting a wave which corresponds to the signal of the generator towards a target, means for receiving the wave reflected by the target, means for forming a beat signal between the signals which correspond to the transmitted and received waves, and means for forming an error signal which corresponds to the frequency variation between the frequency of the beat signal and a fixed frequency.

In prior art devices of this type such as the radioaltimeter described in applicants' French Pat. No. 1,557,670 the error signal is utilized in a control loop for directly controlling the slope of the modulation signal supplied by the modulator in order to cancel the above-mentioned frequency variation. As the loop is stabilized, the period of the modulation signal is proportional to the trip to the target and back of the transmitted wave and is utilized in measuring for the distance between the device and the target.

With prior art devices of this type, the range measurements are effected with a precision in the order of 3%. A great number of applications, for example, measurement of altitudes of high flying airplanes or of various industrial distances, however, require a much greater accuracy making it desirable to improve this precision by a factor of approximately 10.

As is disclosed in the above-mentioned Patent and also in French patent application 74 35 433 filed in the name of Applicants on Oct. 22, 1974, which has been laid open to public inspection under French Pat. No. 2,288,986, an improved precision is obtained by calibrating the apparatus at regular intervals by means of a delay line which is periodically substituted for the distance to be measured. However, in addition to the fact that this procedure requires commutator circuits and storage devices for retaining, during the duration of the calibration and the measurement, the measuring and calibrating values, respectively, such a method is nevertheless inadequate to obtain the desired precision in the order of 0.3%.

A study of the problem and thorough experiments carried out by applicants have shown that an important parameter affecting the measurement precision is the linearity of the frequency modulation. First of all, the proportionality between the modulation period and the distance can only be accurately verified if the modulation of the frequency of the transmitted signal rigorously follows a linear law. In addition, when the target has a diffusing surface (such as the earth in height measurements), the concentration of the pulse spectrum in a narrow band is a function of the linearity of the modulation and this concentration is necessary to obtain a proper precision.

It is therefore an object of the invention to provide a range measuring apparatus of the frequency modulation type, which has an improved precision and which simultaneously ensures in a simple manner the linearity of the frequency modulation and an automatic calibration without switching.

In accordance with the invention, the range measuring apparatus comprises means for forming a permanent second beat signal between two signals which are derived from the generator, one of the signals being delayed by a delay line. A phase detector receives the second beat signal and the signal of a controlled frequency oscillator, and provides an output signal for controlling the slope of the modulation signal supplied by the modulator while the above-mentioned error signal controls the frequency of the signal of the oscillator.

The following description which is given with reference to the attached drawings, will fully explain how the invention can be realised.

Figure 1:
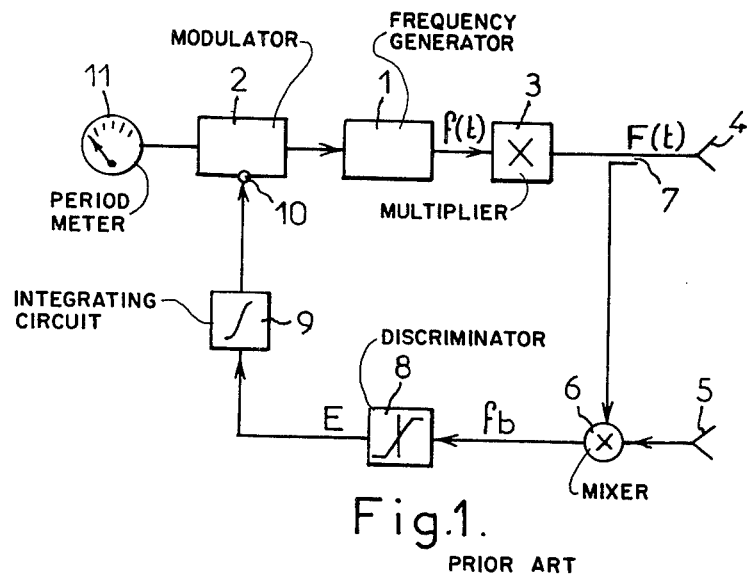
FIG. 1 shows the circuit diagram of a prior art range measuring apparatus of the frequency modulation type.

To make the differences and the advantages of the range measuring apparatus of the invention very clear with respect to known apparatus of the frequency modulation type, FIG. 1 shows the circuit diagram of a known apparatus, for example, such as that disclosed in the above mentioned patent and the patent application.

Such a known apparatus comprises a controlled frequency generator 1 which, under the control of a modulator 2 producing a sawtooth signal, supplies a signal whose frequency is linearly modulated. The frequency $f(t)$ of generator 1 is multiplied by $m$ in the frequency multiplier 3 which supplies a frequency $F(t)$ to the transmitting antenna 4. The wave transmitted by the antenna 4 is reflected by a target, not shown in the drawing, and the reflected wave is received by the receiving antenna 5.

Figure 2:
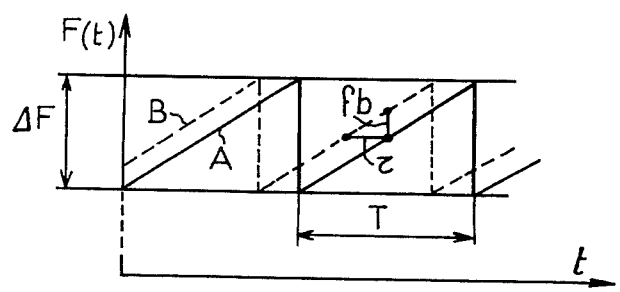
FIG. 2 shows a diagram which illustrates the operation of the apparatus shown in FIG. 1.

The frequency variations of the transmitted and received waves as a function of time have the form of a sawtooth which is shown in the diagram of FIG. 2 by curves A and B, respectively. These curves have the same form as the modulation signal supplied by the modulator 2. The modulation period is indicated by T. The curves A and B are shifted relative to one another over a period $\tau = 2D/C$ which corresponds to the propagation time of the wave from the antenna 4 to the antenna 5 through the target, D being the average distance from the antennas to the target and C being the propagation speed of the wave.

The mixer 6 forms a beat signal $f_b$ between a fraction of the transmitted signal supplied by the coupler 7 and the received signal. The beat frequency $f_b$ appears as the frequency shift between the slopes of the curves A and B of the diagram of FIG. 2.

From the diagram of FIG. 2 it follows that if the frequency variations represented by the curves A and B are perfectly linear during each modulation period, then:

$$\Delta F/T = f_b/\tau \qquad (1)$$

The beat frequency $f_b$ is applied to the frequency discriminator 8 whose fixed central frequency is $f_o$ and which supplies a signal E which is representative of the frequency variation $f_b - f_o$. This signal is applied by means of the integrating circuit 9 to the control terminal 10 of modulator 2 for modifying the slope of the modulating signal into a sawtooth. In this manner a control loop is formed whose error signal is constituted by the output signal E of discriminator 8 and, as this loop is stabilised, the signal error is cancelled and one obtains:

$$f_b = f_o$$

Formula (1) then becomes:

$$\Delta F/T = f_o/\tau \qquad (2)$$

From this is derived:

$$T = (2\Delta F/C \cdot f_o) \cdot D \qquad (3)$$

Equation (3) shows that if the frequency deviation $\Delta F$ is kept constant, the modulation period T will be proportional to the distance D so that the range measurement D can be supplied by a period meter 11 which measures the period T of the modulation signal.

As previously mentioned, it is known that the precision of the apparatus may be improved by periodically using a calibrated delay line instead of the trajectory 2D between the antennas 4 and 5 via the target. The reading of the period meter is then brought to a value which corresponds to the known delay $\tau_o$ provided by the delay line. Although this makes it possible to avoid deviations due to the frequency deviation $\Delta F$, the precision of the apparatus may nevertheless be affected by the modulation distortions which correspond to non-linearity of the frequency modulation.

Figure 3:
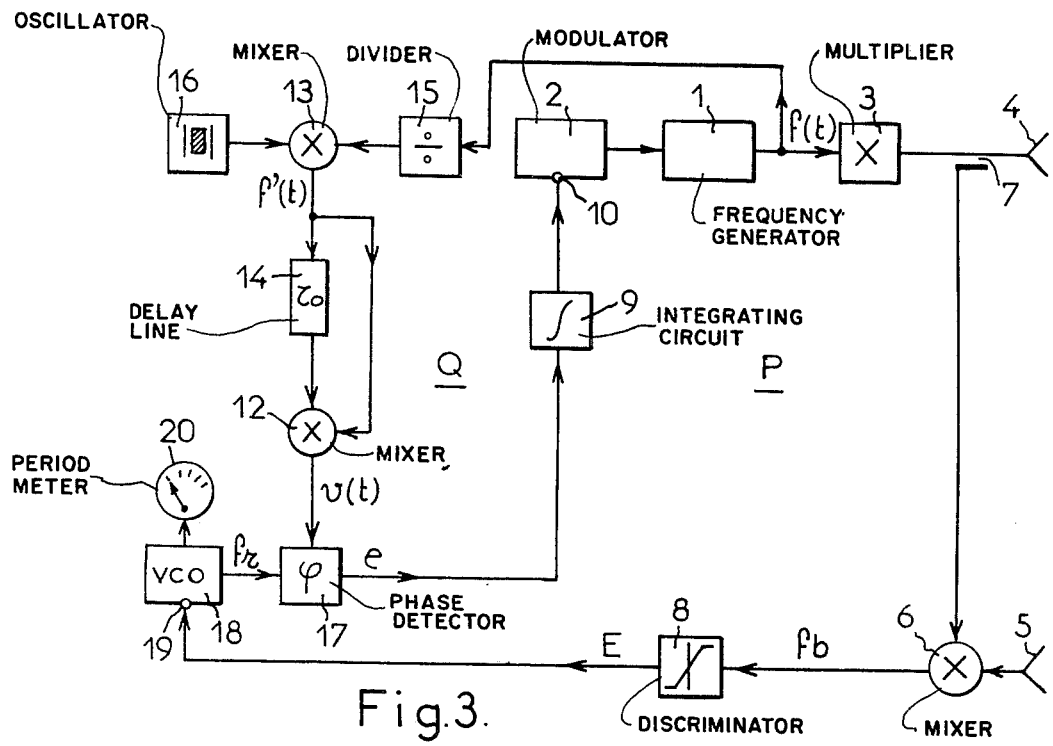
FIG. 3 is a circuit diagram of a range measuring apparatus in accordance with the invention.

The apparatus of the invention, the circuit diagram of which is shown in FIG. 3, makes it possible to simultaneously obtain at the same time a substantially perfect linearity of the modulation and the independancy of the value of measurement T as regards the frequency deviation $\Delta F$.

The apparatus of the invention comprises, in addition to the elements described with respect to FIG. 1 and which have been given the same reference numerals, a mixer 12 which forms a permanent second beat-frequency signal $v(t)$ between two signals, one of which is the signal at the output of mixer 13, the other being the latter signal shifted over the duration $\tau_o$ by the delay line 14. Applied to an input of the mixer 13 is a signal which is derived from the frequency signal $f(t)$ at the output of generator 1 by dividing the frequency of signal $f(t)$ by a factor $k$ in the frequency divider 15. A fixed frequency signal supplied by the quartz oscillator 16 is applied to the other input of the mixer 13.

The second beat signal supplied by the mixer 12 is applied to an input of the phase detector 17. Applied to the other input of phase detector 17 is a frequency signal $f_r$ supplied by the controlled frequency oscillator 18 which will be called VCO 18 hereinafter. The output signal $e$ of the detector 17 is applied by means of the integrating circuit 9 to the control terminal 10 of the modulator 2 for controlling the slope of the modulation signal. Finally the error signal E supplied by discriminator 8 is applied to the control terminal 19 of VCO 18 to control the frequency $f_r$ of its output signal. A period meter 20 measures the period which corresponds to the frequency $f_r$ to furnish the range indication.

In the circuit diagram of FIG. 3 which has just been described, it is possible to distinguish, from the functional point of view, the control loop P which is utilized for the range measurement and whose object is, as in the prior art apparatus, to cancel the frequency variation between the pulsed frequency $f_b$ at the output of the mixer 6 and the central frequency $f_o$ of the frequency discriminator 8. It should, however, be noted that the error signal E at the output of the discriminator 8 is not utilized in the same manner as in the prior art apparatus and operates by the intermediary in components of another control loop Q whose object is to keep the slope of the sawtooth modulation signal supplied by the modulator 2 constant for the entire duration of a cycle of this signal.

Figure 4:
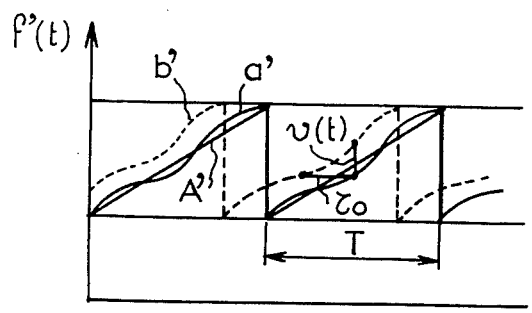
FIG. 4 shows a diagram for explaining the operation of the apparatus in accordance with the invention.

The operation of the control loop Q will now be described. The mixer 13 transposes the frequency $(1/k)f(t)$ supplied by the frequency divider 15 into a much lower frequency $f'(t) = (1/k)f(t) - f_1$, $f_1$ being the fixed frequency of the quartz oscillator 16. The frequency variations $f'(t)$ applied directly to an input of the mixer 12 are represented in the diagram of FIG. 4 by the curve $a'$. Curve $a'$ does not exactly follow the ideal curve A' which would be obtained if the modulation were perfectly linear, that is to say if the slope of the modulation $df(t)/dt$ of the generator 1 were constant during a cycle of modulation T. Variations in the frequency $f'(t)$ applied to the other input of the mixer 12 by means of the delay line 14 are shown by the curve $b'$ which results from shifting the curve $a'$ over a duration equal to the delay $\tau_o$ supplied by the delay line. The beat frequency $v(t)$ at the output of the mixer 12 corresponds to the frequency shift of the slopes of curves $a'$ and $b'$ and it will be seen that the slope $df'(t)/dt$ of the curve $a'$ is equal to $v(t)/\tau_o$ at each instant $t$. Taking into account the relationship between $f'(t)$ and $f(t)$ hereinafter discussed, it can be derived that $$v(t) = \frac{\tau o}{K} \frac{d f(t)}{dt} \qquad (4)$$

Formula (4) indicates that at any given instant $t$ the beat frequency $v(t)$ at the output of mixer 12 is proportional to the slope $df(t)/dt$ of the frequency modulation $f(t)$ supplied by the generator 1.

The phase detector 17 compares the phase $\varphi(t)$ of the frequency signal $v(t)$ supplied by the mixer 12 with the phase $\varphi_r$ of the frequency signal $f_r$ supplied by the VCO 18. As will be seen hereinafter, it may be assumed that the phase $\varphi_r$ is a constant reference phase during a modulation period T. Applying the output signal $e$ of the phase detector 17 to the control terminal 10 of the modulator 2 for controlling the slope of the modulation signal closes the control loop Q. It will be clear to one skilled in the art that the loop Q permits locking the phase $\varphi(t)$ on the reference phase $\varphi_r$ and, finally, to bring the beat frequency $v(t)$ under the control of the frequency $f_r$ of the VCO 18.

Then the above formula (4) may be written as:

$$f_r = \frac{\tau o}{k} \frac{d f(t)}{dt} \qquad (5)$$

Formula (5) shows that as far as the frequency $f_r$ is constant during a modulation period T the slope $df(t)/dt$ of the frequency modulation $f(t)$ is constant during the period T. This achieves one of the goals in the improvement of the measurement precision, namely a linear frequency modulation. It is clear that in these circumstances it is possible to replace in formula (5) the instantaneous slope of the modulation $df(t)/dt$ which is constant during the period T by the relation $\Delta f/T$, $\Delta f$ being the frequency excursion of the signal $f(t)$. Then the following formula is obtained:

$$f_r = (\tau_o/k)(\Delta f/dt) \qquad (6)$$

The control loop P of the range measurement is again closed while applying the output signal E of the frequency discriminator 8 to the control terminal 19 of the VCO 18 for controlling the frequency $f_r$. The variations in the distance to be measured, for example the variations in the altitude of an aeroplane are generally slow. In any case one can connect a suitable low-pass filter, not shown in the drawing, at the output of the frequency discriminator 8, so that under the action of the output signal E, $f_r'$ the output of the VCO 18, does not vary substantially during a modulation period T. The control loop Q then operates as indicated above and the formula (6) is applicable. This formula shows that the slow modification of the frequency $f_r$ produced in the range loop P modifies the slope $\Delta f/T$ again and, finally, the slope $\Delta F/T$ of the modulation of the frequency of the transmitted signal. As in the prior art apparatus the range loop P operates in such a way that it makes the beat frequency $f_b$ and the fixed central frequency $f_o$ of the frequency discriminator 8 equal. When this situation has been obtained the formula (2) applies.

Taking the relations $\tau = (2D/C$ and $\Delta F = m\ \Delta f$ into account, $m$ being the multiplication factor produced by the frequency multiplier 3 and by combining the relations (2) and (6) one can easily show that:

$$\frac{1}{f_r} = T_r = \left(\frac{2km}{C} \cdot \frac{1}{\tau_o} \cdot \frac{1}{f_o}\right) \cdot D \qquad (7)$$

Measuring the period $T_r$ which corresponds to the frequency $f_r$, performed by the period meter 20 thus constitutes a range measurement D. The proportionality coefficient depends only on the fixed magnitudes $(k, m)$ or standards $(\tau_o, f_o)$. Thus an automatic calibration of the apparatus has been realised.

As regards the production of the standard duration $\tau_o$ by the delay line 14 it is advantageous, for reasons of economy in particular, to utilise a delay line of the type which is currently used in colour television receivers and which supplies a delay $\tau_o = 64\ \mu s$ for a working frequency of 4.2 MHz. If, for example, the central frequency of the generator 1 is 400 MHz this working frequency will be obtained with a dividing factor of 4 in the divider 15 and a fixed frequency of 95.8 MHz in the quartz oscillator 16.

When there is considerable variation in the distance D to be measured, then a problem may be encountered in controlling the frequency $f_r$ of the VCO 18 which must vary in the inverse sense to the same extent. For example, when the formula (7) is applied in the case where the distance D varies between 2,000 $m$ and 20,000 $m$ and if the constants are: $k = 4$, $m = 11$, $\tau_o = 64\ \mu s$, $f_o = 100$ kHz, then $f_r$ must vary between 21.8 kHz and 2.18 kHz.

Figure 5:
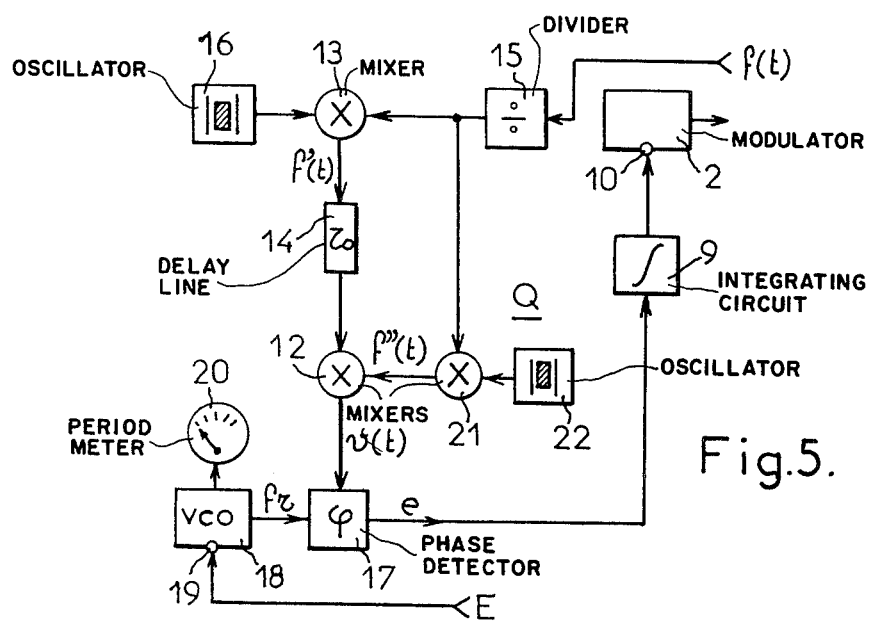
FIG. 5 is a circuit diagram of a variant of the apparatus according to the invention.

This problem is solved by performing the modifications in the control loop Q as shown in the circuit diagram of FIG. 5 which comprises the components of FIG. 3 which and which have been given the same reference numerals. In the diagram of FIG. 5, instead of applying two signals of the same frequency $f'(t)$, one of which is delayed by $\tau_o$ and the other is not delayed, there are applied to the mixer 12, on the one hand, the frequency signal $f'(t)$ delayed over $\tau_o$ and, on the other hand a non-delayed frequency $f''(t)$ modulated in accordance with the same slope as the frequency $f'(t)$ but shifted in the direction by a the higher frequencies of fixed frequency H : $f''(t) = f'(t) + H$. This frequency $f''(t)$ is obtained by means of the mixer 21 which receives, on the one hand, the output frequency of the divider 15 and, on the other hand the fixed frequency supplied by the quartz oscillator 22.

It can be shown that in this arrangement the beat frequency $v(t)$ at the output of mixer 12 is consequently related to the slope $df(t)/dt$ of the modulation signal by means of the following relation (8) which replaces the relation (3) mentioned above.

$$v(t) = H + \frac{\tau_o}{K} \cdot \frac{df(t)}{dt} \qquad (8)$$

Since the effect of the control loop is to make the frequency $f_r$ of the VCO 18 and the beat frequency $v(t)$ equal, it can be seen that the ultimate effect of the modification shown in FIG. 5 is to shift the frequency $f_r$ by a fixed frequency H in the direction of the higher frequencies for which the range loop P is stabilised. If for example $H = 200$ kHz, the frequency $f_r$ will vary in the above example from 221.8 kHz to 202.18 kHz.

What is claimed is:

1. A range measuring apparatus, particularly for altitude measurements, comprising a generator controlled by a modulator for supplying a signal whose frequency is linearly modulated, means for emitting towards a target a wave which corresponds to the signal of said generator, means for receiving the wave reflected by the target, means for forming a beat signal between the signals which correspond to the transmitted and received waves, means for forming an error signal which corresponds to the frequency variation between the frequency of the beat signal and a fixed frequency, means for forming a permanent second beat signal between two signals which are obtained from said generator and one of which is delayed by a delay line, a phase detector which receives said second beat signal and a signal from a controlled frequency oscillator, wherein the output signal of the phase detector controls the slope of the modulation signal supplied by the modulator while said error signal controls the frequency of the signal of said oscillator.

2. A range measuring apparatus as claimed in claim 1, wherein said means for forming said second beat signal includes a mixer circuit to which said two signals of the generator are applied such that the same modulation slope and the same frequency are presented, one of these signals furthermore passing through the delay line.

3. A range measuring apparatus as claimed in claim 1 wherein the delay line is of the type used in television receivers.

4. A range measuring apparatus as claimed in claim 1, wherein said means for forming said second beat signal includes a first mixer circuit coupled to said generator for producing one of said two signals, a second mixer circuit coupled to said generator for producing the other of said two signals, said other signal having the same modulation slope as that of said one signal and a frequency which differs from the frequency of said one signal by a fixed value, and a mixer coupled to each of said first and second mixer circuits for forming said second beat signal between said two signals, said mixer being coupled to one of said first and second mixer circuits by said delay line.

* * * * *